United States Patent
Wang et al.

(10) Patent No.: US 11,967,547 B2
(45) Date of Patent: Apr. 23, 2024

(54) SOLDER RESIST STRUCTURE TO MITIGATE SOLDER BRIDGE RISK

(71) Applicant: Taiwan Semiconductor Manufacturing Company, Ltd., Hsinchu (TW)

(72) Inventors: Chin-Hua Wang, New Taipei (TW); Shu-Shen Yeh, Taoyuan (TW); Po-Chen Lai, Hsinchu County (TW); Po-Yao Lin, Zhudong Township (TW); Shin-Puu Jeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/412,641

(22) Filed: Aug. 26, 2021

(65) Prior Publication Data
US 2023/0061167 A1  Mar. 2, 2023

(51) Int. Cl.
*H01L 23/498* (2006.01)
*H01L 23/00* (2006.01)
*H01L 23/14* (2006.01)
*H01L 25/065* (2023.01)

(52) U.S. Cl.
CPC ...... *H01L 23/49822* (2013.01); *H01L 23/147* (2013.01); *H01L 23/49816* (2013.01); *H01L 23/49838* (2013.01); *H01L 24/17* (2013.01); *H01L 25/0652* (2013.01); *H01L 2224/17104* (2013.01)

(58) Field of Classification Search
CPC ... H01L 2224/11013; H01L 2224/1111; H01L 2224/27013; H01L 2224/2711; H01L 2224/10145; H01L 2224/10175; H01L 2224/26145; H01L 2224/03013; H01L 25/0652
See application file for complete search history.

(56) References Cited

U.S. PATENT DOCUMENTS

| | | | |
|---|---|---|---|
| 5,889,655 A * | 3/1999 | Barrow | H05K 3/3452 361/779 |
| 2008/0116574 A1* | 5/2008 | Fan | H01L 23/3128 257/738 |
| 2010/0000775 A1* | 1/2010 | Shen | H05K 3/3452 174/260 |
| 2016/0276307 A1* | 9/2016 | Lin | H01L 23/562 |
| 2018/0068937 A1* | 3/2018 | Marimuthu | H01L 24/82 |
| 2020/0118900 A1* | 4/2020 | Tai | H01L 23/3128 |
| 2020/0388564 A1* | 12/2020 | Chou | H01L 24/73 |

* cited by examiner

*Primary Examiner* — Phat X Cao
*Assistant Examiner* — William Henry Anderson
(74) *Attorney, Agent, or Firm* — Eschweiler & Potashnik, LLC

(57) ABSTRACT

Some embodiments relate to a semiconductor structure. The semiconductor structure includes a first substrate including a first plurality of conductive pads that are laterally spaced apart from one another on the first substrate. A first plurality of conductive bumps are disposed on the first plurality of conductive pads, respectively. A multi-tiered solder-resist structure is disposed on the first substrate and arranged between the first plurality of conductive pads. The multi-tiered solder-resist structure has different widths at a different heights over the first substrate and contacts sidewalls of the first plurality of conductive bumps to separate the first plurality of conductive bumps from one another.

20 Claims, 12 Drawing Sheets

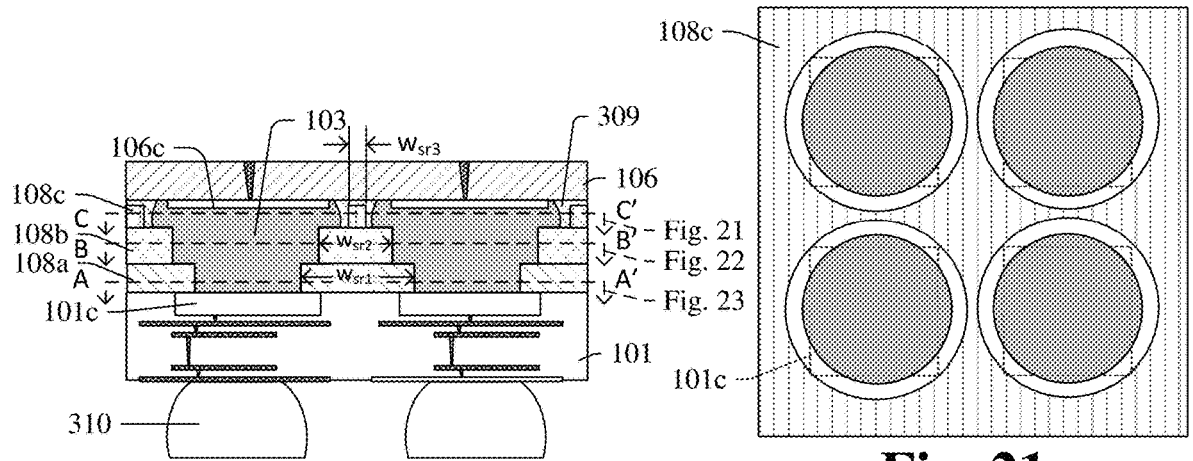
Fig. 19
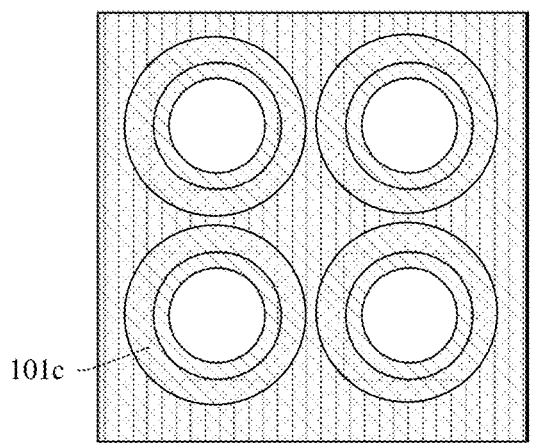
Fig. 20
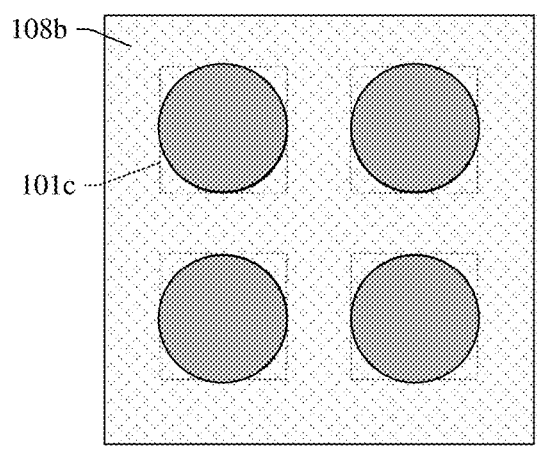
Fig. 21
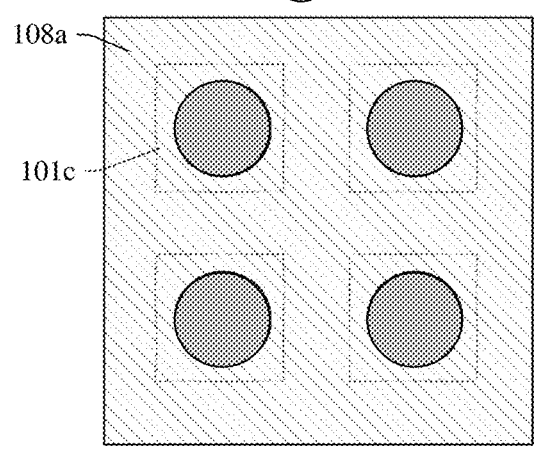
Fig. 22
Fig. 23

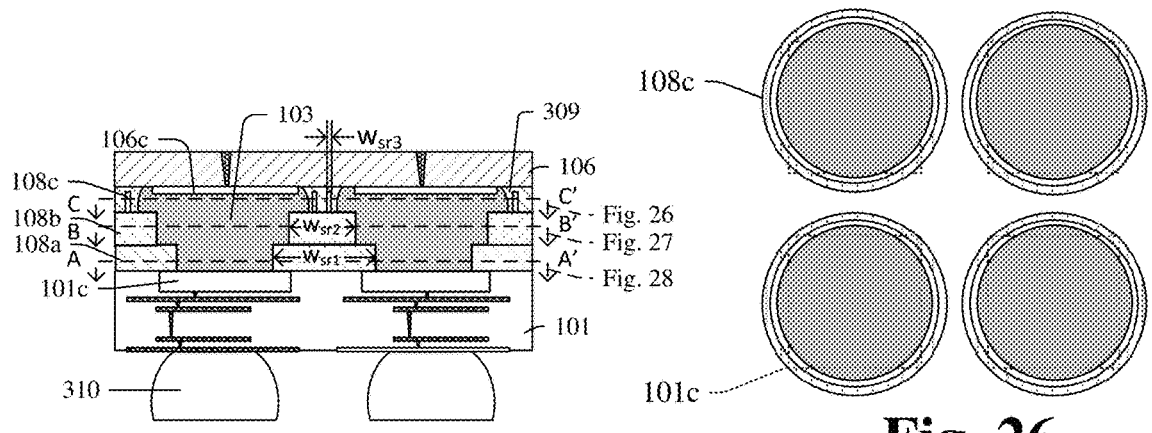
Fig. 24
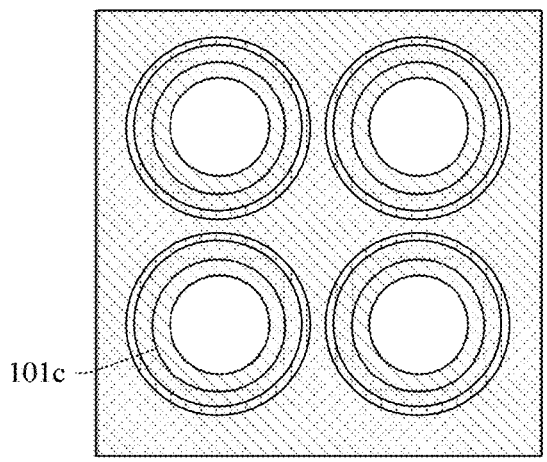
Fig. 25
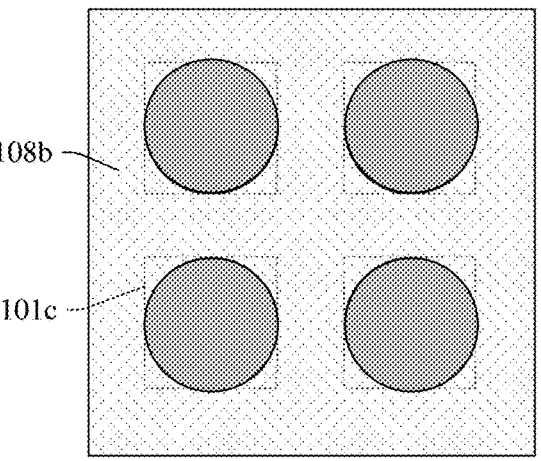
Fig. 26
Fig. 27
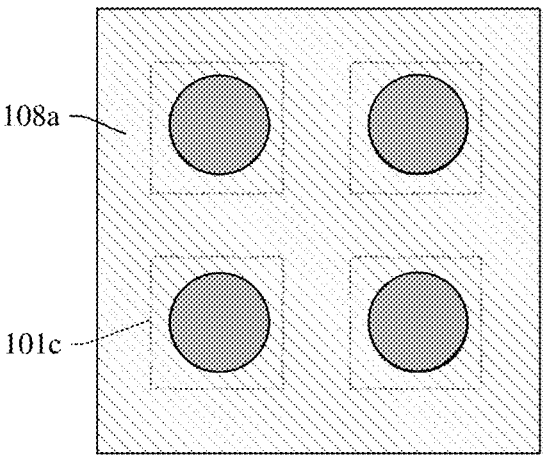
Fig. 28

US 11,967,547 B2

SOLDER RESIST STRUCTURE TO MITIGATE SOLDER BRIDGE RISK

BACKGROUND

Integrated circuits (ICs) using semiconductor devices are essential for many modern applications. With the advancement of electronic technology, the semiconductor devices are becoming increasingly smaller in size while having greater functionality and greater amounts of integrated circuitry. At the same time, the footprint of ICs is increasing for successive generations of technology, whereby the smaller feature sizes in combination with the larger IC footprints provides each generation of IC with significantly more processing power than previous generations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 illustrates a cross sectional view of a semiconductor structure in accordance with some embodiments of the present disclosure.

FIG. 20 illustrates a top view showing a first tier, a second tier, and a third tier superimposed over each other in accordance with some embodiments of FIG. 19.

FIG. 21 illustrates a top view of a third tier in accordance with some embodiments of FIG. 19.

FIG. 22 illustrates a top view of a second tier in accordance with some embodiments of FIG. 19.

FIG. 23 illustrates a top view of a first tier in accordance with some embodiments of FIG. 19.

FIG. 24 illustrates a cross sectional view of a semiconductor structure in accordance with some embodiments of the present disclosure.

FIG. 25 illustrates a top view showing a first tier, a second tier, and a third tier superimposed over each other in accordance with some embodiments of FIG. 24.

FIG. 26 illustrates a top view of a third tier in accordance with some embodiments of FIG. 24.

FIG. 27 illustrates a top view of a second tier in accordance with some embodiments of FIG. 24.

FIG. 28 illustrates a top view of a first tier in accordance with some embodiments of FIG. 24.

DETAILED DESCRIPTION

Figure 1A:
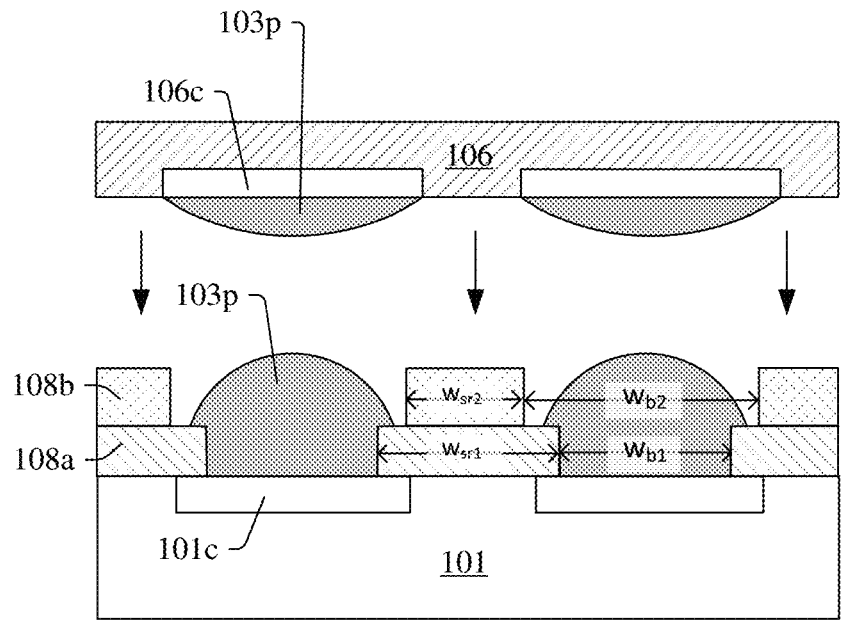
FIG. 1A illustrates a cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In this document, the term "coupled" may also be termed as "electrically coupled", and the term "connected" may be termed as "electrically connected". "Coupled" and "connected" may also be used to indicate that two or more elements cooperate or interact with each other.

As integrated circuits (ICs) continue to evolve, feature sizes of devices, such as transistors on the ICs continue to scale smaller and smaller with each technology generation. At the same time, the die area (footprint) of these ICs increases. The combination of the smaller features and the larger footprint provides each generation of IC with significantly more processing power than previous generations. In order to allow these ICs to be operably coupled to circuit boards, other ICs, testers, and the like; conductive bumps, such as solder bumps or pillars, are arranged on the exterior of the IC. As the ICs become more complex, it is desirable to increase the number of conductive bumps that are available to enable better connectivity. Further, within 3D ICs, which include a number of substrates "stacked" over one another and encased in a single package, the substrates can be interconnected with one another by such conductive bumps internally within the package.

Some aspects of the present disclosure appreciate that substrates can experience warpage or bending, due to a variety of reasons. With regards to conductive bumps within a package, for example, this substrate warpage can cause some of the conductive bumps to "squeeze" or compress together in some areas and "pull apart" from one another in other areas. Due to the "squeezing", this warpage can ultimately cause adjacent conductive bumps to inadvertently short or "bridge" to one another, leading to failure or other issues in the final device. Therefore, the present disclosure provides multi-tiered solder-resist structures that are spaced between adjacent conductive bumps to prevent bridging, and thereby ensure those adjacent conductive bumps remain isolated from one another.

Figure 1B:
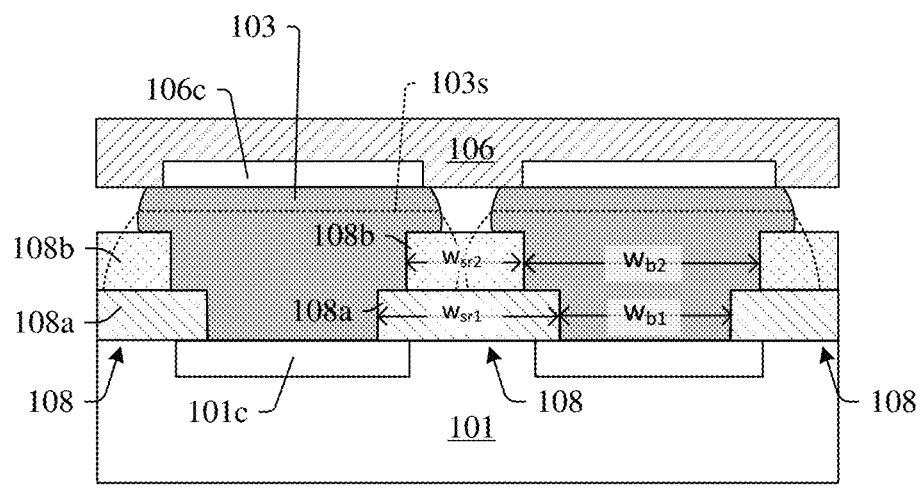
FIG. 1B illustrates a cross sectional view of a semiconductor structure in accordance with some embodiments of the present disclosure.

FIGS. 1A-1B are cross sectional views of semiconductor structures 100 in accordance with various embodiments of the present disclosure. As can be seen from FIG. 1A, in some embodiments, prior to bonding, a semiconductor structure 100 includes a first substrate 101 and a second substrate 106. The first substrate 101 includes a first plurality of connection structures 101c, such as conductive pillars or bond pads, and the second substrate 106 includes a second plurality of connection structures 106c, such as conductive pillars or bond pads, which correspond to the first plurality of connection structures 101c. The first substrate 101 may also include pre-solder structures 103p on the first connection structures 101c, and the second substrate 101 may also include pre-solder structures 103p on the second connection structures 106c.

When the first substrate 101 is soldered to the second substrate 106 as shown in FIG. 1B, the pre-solder structures 103p merge to establish a plurality of first conductive bumps 103 that couple the first substrate 101 to the second substrate 106. Typically, the conductive bumps 103 comprise solder, and have a generally dome-like shape. However, during this soldering/bonding, as the first substrate 101 and second substrate 106 are pressed closer to one another, at least some of the conductive bumps 103 can be compressed slightly in the vertical direction and extend/bulge outwards slightly in the horizontal direction. Absent countermeasures, adjacent conductive bumps could squeeze to such an extent that they short or "bridge" to one another (see dashed lines 103s in FIG. 1B). Thus, to limit or prevent such shorting, the present disclosure includes a multi-tier solder resist structure 108 disposed between adjacent conductive bumps 103. This multi-tier solder resist structure 108 is made of dielectric material, such as epoxy or polymer or polyimide or any dielectric material, and provides solder bump openings having different widths at different heights over the first substrate 101. By limiting or preventing the adjacent conductive bumps 108 from shorting or bridging to one another, the multi-tier solder resist structure 108 provides better manufacturing yield and/or reliability than previous techniques.

More particularly, FIGS. 1A-1B illustrate embodiments where the multi-tier solder resist structure 108 includes a first tier 108a and a second tier 108b. The dielectric material of the first tier 108a has a first width, $w_{sr1}$, and in some cases can extend over peripheral edges of adjacent connection structures of the first plurality of connection structures 101c. Thus, the dielectric material of the first tier 108a defines a first tier conductive bump opening having a first opening width, $w_{b1}$, to accommodate a base portion of the conductive bump 103. The dielectric material of the second tier 108b has a second width, $w_{sr2}$, which is less than the first width, $w_{sr1}$. Thus, the dielectric material of the second tier 108b defines a second tier conductive bump opening having a second opening width, $w_{b2}$, to accommodate a mid- or upper-portion of the conductive bump 103.

In some cases, a ratio of $w_{sr1}$ to $w_{sr2}$ can range from approximately 1.1:1 to approximately 2:1; and a ratio of wb1 to wb2 can range from approximately 1:1.1 to approximately 1:2. In some cases, the multi-tier solder resist structure 108 also increases a height of the conductive bumps 103 compared to previous approaches, and as such a height of the conductive bumps 103 measured from an upper surface of the first substrate 101 (e.g., upper surface of the first connection structure 101c) to a lower surface of the second substrate 106 (or lower surface of the second connection structure 106c) may, for example, range from approximately 1.1:1 to approximately 2:1. This multi-tier solder resist structure 108 thereby allows for the conductive bump openings to accommodate the conductive bumps 103 in a manner that limits bridging and/or shorting of the conductive bumps to provide higher yield and/or better reliability compared to previous approaches.

Figure 2A:
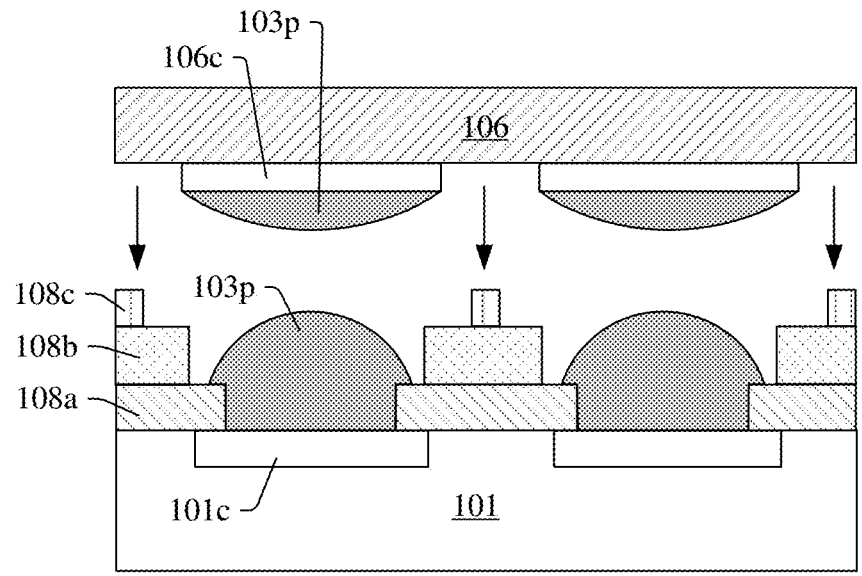
FIG. 2A illustrates a cross sectional view of a semiconductor structure in accordance with some embodiments of the present disclosure.
Figure 2B:
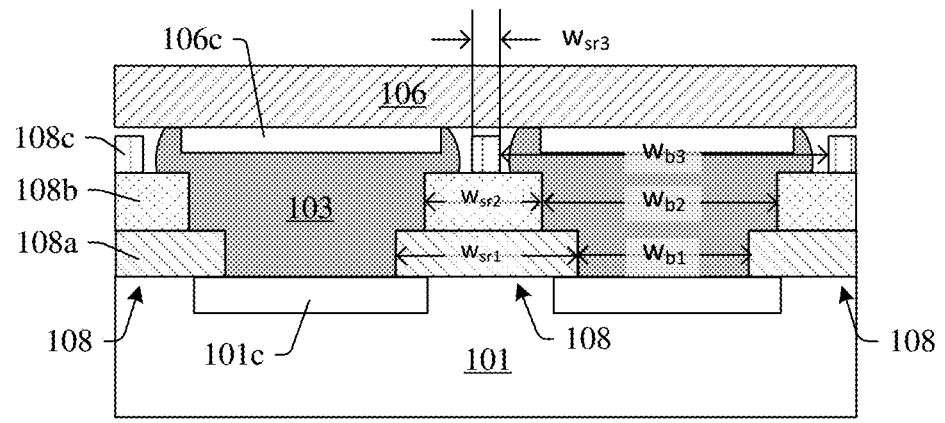
FIG. 2B illustrates a cross sectional view of a semiconductor structure in accordance with some embodiments of the present disclosure.

FIGS. 2A-2B illustrate other embodiments of a semiconductor structure 200 where the multi-tier solder resist structure 108 includes a first tier 108a, a second tier 108b, and a third tier 108c. As can be seen from FIG. 2A, in some embodiments, prior to bonding, the semiconductor structure 200 includes a first substrate 101 including a first plurality of connection structures 101c, and a second substrate 106 including a second plurality of connection structures 106c. The first substrate 101 may include pre-solder structures 103p on the first connection structures 101c, and the second substrate 101 may also include pre-solder structures 103p on the second connection structures 106c. When the first substrate 101 is soldered to the second substrate 106 as shown in FIG. 2B, the pre-solder structures 103p again merge to form conductive bumps 103 and the dielectric material of the first tier 108a, second tier 108b, and third tier 108c again prevent and/or limit bridging or shorting of the conductive bumps 103. The first tier 108a has a first width, $w_{sr1}$, and in some cases can extend over peripheral edges of the adjacent connection structures 101c. Thus, the dielectric material of the first tier 108a has an inner edge that defines a first tier conductive bump opening having a first opening width, wb1, to accommodate a base portion of the conductive bump 103. The dielectric material of the second tier 108b has a second width, $w_{sr2}$, which is less than the first width, $w_{sr1}$. Thus, the dielectric material of the second tier 108b has an inner edge that defines a second tier conductive bump opening having a second opening width, $w_{b2}$, to accommodate a mid- or upper-portion of the conductive bump 103. The dielectric material of the third tier 108c has a third width, $w_{sr3}$, which is less than the second width, $w_{sr2}$. Thus, the dielectric material of the third tier 108b has an inner edge that defines a third tier conductive bump opening having a third opening width, $w_{b3}$, to accommodate an upper portion of the conductive bump 103. In some cases, a ratio of wsr2 to wsr3 can range from approximately 1.1:1 to approximately 2:1; and a ratio of wsr1 to ws3 can range from approximately 1.21:1 to approximately 4:1. In some cases, a ratio of wb2 to wb3 can range from approximately 1:1.1 to approximately 1:2; and/ or a ratio of wb1 to wb3 can range from approximately 1:1.21 to approximately 1:4. The multi-tier solder resist structure 108 helps to limit and/or prevent bridging and/or shorting of the conductive bumps 103.

Although FIGS. 1A-1B and FIGS. 2A-2B illustrate two-tier and three tier structures, respectively, multi-tier solder-resist structures in general can include any number of tiers, with the tiers generally being tapered so lower tiers are wider (corresponding to narrower connection bump openings at the height of the lower tiers) and higher tiers are more narrow (corresponding to wider connection bump openings at the height of the higher tiers). This facilitates more reliable formation and operation for the conductive bumps 103 compared to previous approaches.

Figure 3:
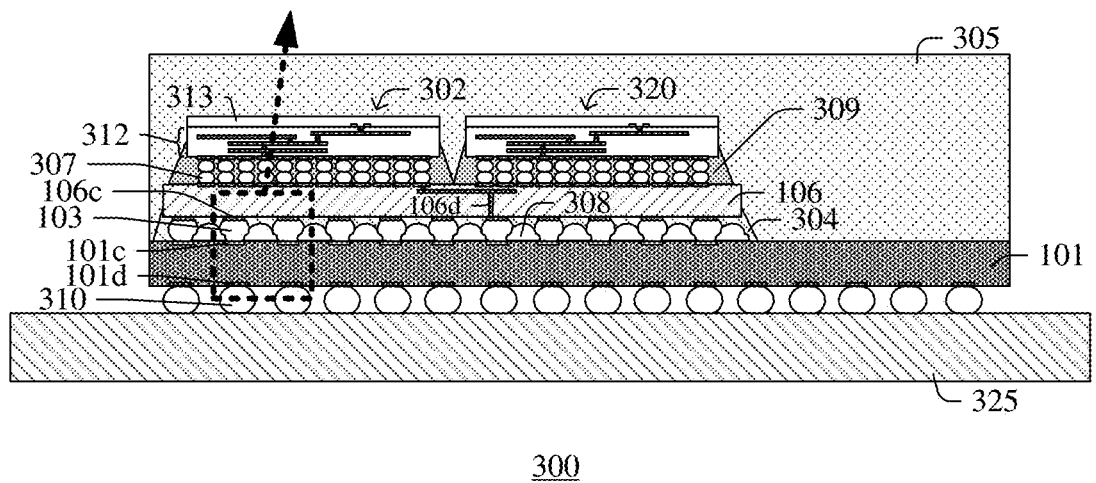
FIG. 3 illustrates a cross sectional view of a semiconductor structure in accordance with some embodiments of the present disclosure.

FIG. 3 is a cross sectional view of another semiconductor structure 300 that includes a multi-tier solder-resist structure in accordance with various embodiments of the present disclosure, and subsequent figures (e.g., FIGS. 4, 7, 10, 13, 16, 19, 24, and 29) provide inset views of more detailed embodiments that are generally consistent with the semiconductor structure 300 of FIG. 3. In some embodiments, the semiconductor structure 300 includes a first substrate 101 and a second substrate 106, with a first die 302 and second die 320 disposed over the second substrate 106. A plurality of first conductive bumps 103 couple the first substrate 101 to the second substrate 106, and a plurality of second conductive bumps 307 couple the first die 302 and/or second die 320 to the second substrate 106 and optionally to the first substrate 101 through the second substrate 106. A first underfill 304 and a second underfill 309 can also be present, and a molding 305 can define outer extents of the semiconductor structure 300.

In some embodiments, the semiconductor structure 300 is a semiconductor package. In some embodiments, the semiconductor structure 300 is a chip on wafer on substrate (COWOS) packaging structure. In some embodiments, the semiconductor structure 300 is a system on integrated chip (SoIC) packaging structure. In some embodiments, the semiconductor structure 300 is a three dimensional integrated circuit (3D IC).

In some embodiments, the first substrate 101 is a semiconductor substrate. In some embodiments, the first substrate 101 includes semiconductor material such as monocrystalline silicon, germanium, gallium, arsenic, or combinations thereof. In some embodiments, the first substrate 101 is an interposer or the like, and can be devoid of active semiconductor devices in some instances. In some embodiments, the first substrate 101 is a silicon substrate or silicon interposer. An interposer is an electrical interface routing between one chip, substrate, or other connection to another chip, substrate, or connection. The purpose of an interposer is to spread a connection to a wider pitch or to reroute a connection to a different connection. In some embodiments, the first substrate 101 includes organic material. In some embodiments, the first substrate 101 includes ceramic, polymer or the like. In other embodiments, the first substrate 101 comprises a glass-reinforced epoxy laminate material, and can include woven fiberglass cloth with an epoxy resin binder; or can include an amide. In some embodiments, the first substrate 101 has a quadrilateral, rectangular, square, polygonal or any other suitable shape.

In some embodiments, a first plurality of conductive pads 101c are disposed on the first substrate 101 nearest the second substrate 106. The first conductive pads 101c include a conductive material such as chromium, copper, gold, titanium, silver, nickel, palladium, aluminum, or tungsten, etc. In some embodiments, the first conductive pads 101c are a solderable surface and serve as a platform for receiving the first conductive bump 103.

In some embodiments, the plurality of first conductive bumps 103 are disposed between the first substrate 101 and the second substrate 106 on the first plurality of conductive pads 101c, respectively. In some embodiments, the first conductive bumps 103 have a cylindrical, spherical or hemispherical shape. In some embodiments, each of the first conductive bumps 103 is a solder joint, a solder bump, a solder ball, a ball grid array (BGA) ball, a controlled collapse chip connection (C4) bump, a microbump or the like. In some embodiments, each of the first conductive bumps 103 is a conductive pillar or post. In some embodiments, each of the first conductive bumps 103 include metals such as lead, tin, copper, gold, nickel, etc.

In some embodiments, the second substrate 106 is disposed over the first plurality of conductive bumps 103, and can manifest as an interposer that is optionally devoid of active semiconductor devices, and which is an electrical interface routing between the first substrate 101 and the first die 302 and/or second die 320 for connection to one another. The purpose of such an interposer is to spread a connection to a wider pitch or to reroute a connection to a different connection. In some embodiments, the second substrate 106 is a semiconductor substrate. In some embodiments, the second substrate 106 includes semiconductor material such as silicon, germanium, gallium, arsenic, or combinations thereof. In some embodiments, the second substrate 106 is a silicon substrate. In some embodiments, the second substrate 106 includes organic material. In some embodiments, the second substrate 106 includes resin, epoxy, glass, ceramic, polymer or the like. In some embodiments, the second substrate 106 has a quadrilateral, rectangular, square, polygonal or any other suitable shape.

In some embodiments, a plurality of second conductive pads 106c are disposed on a lower surface of the second substrate 106. In some embodiments, the plurality of second conductive pads 106c are coupled to the plurality of first conductive pads 101c, respectively, through the first conductive bumps 103, respectively. In some embodiments, the second conductive pads 106c are separated from each other on the second substrate 106. In some embodiments, the second conductive pads 106c include a conductive material such as chromium, copper, gold, titanium, silver, nickel, palladium, tungsten, etc. In some embodiments, the second conductive pads 106c are a solderable surface and serve as a platform for receiving a conductive bump.

In some embodiments, a via 106d is disposed within the second substrate 106. In some embodiments, via 106d extends through the second substrate 106. In some embodiments, the via 106d includes a conductive material such as copper, silver, gold, aluminum, etc. In some embodiments, the via 106d is a plated through hole (PTH). In some embodiments, the via 106d is electrically connected with one or more of the second conductive pads 106c. In some embodiments, the via 106d is disposed between two of the second conductive pads 106c.

In some embodiments, the first die 302 and second die 320 are each disposed over the second substrate 106. In some embodiments, the first die 302 and/or the second die 320 is fabricated with a predetermined functional circuit. In some embodiments, the first die 302 and/or the second die 320 comprises a variety of electrical circuits suitable for a particular application. In some embodiments, the electrical circuits include various devices such as transistors, capacitors, resistors, diodes and/or the like. In some embodiments, the first die 302 and/or the second die 320 is a logic device die, application-specific integrated circuit (ASIC) die, application processing (AP) die, memory die, high bandwidth memory (HBM) die or the like. In some embodiments, the first die 302 and/or the second die 320 is a chip or a package. In some embodiments, the first die 302 and/or the second die 320 has a top cross section (a cross section from the top view of the semiconductor structure 300 as shown in FIG. 3) in a quadrilateral, a rectangular or a square shape. In some embodiments, the first die 302 and/or the second die 320 is a CMOS chiplet that includes four ARM® Cortex®-A72 cores. In some embodiments, the first die 302 includes a silicon substrate 313 and an interconnect structure 312. In some embodiments, the first die 302 and/or second die 320 each includes a plurality of dies stacked over each other, and the stacked dies are electrically connected by several connectors.

In some embodiments, a plurality of second conductive bumps 307 bond the first die 302 and/or the second die 320 to the second substrate 106. In some embodiments, the second conductive bumps 307 are disposed between the second substrate 106 and the first die 302. In some embodiments, the second conductive bumps 307 are disposed between the second substrate 106 and the second die 320. In some embodiments, the first die 302 is electrically connected to the first substrate 101 through the first conductive bumps 307.

In some embodiments, each of the second conductive bumps 307 is in a cylindrical, spherical or hemispherical shape. In some embodiments, the second conductive bumps 307 are each a solder joint, a solder bump, a solder ball, a ball grid array (BGA) ball, a controlled collapse chip connection (C4) bump, microbump or the like. In some embodiments, the second conductive bumps 307 are a conductive pillar or post. In some embodiments, the second conductive bumps 307 include metals such as lead, tin, copper, gold, nickel, etc. In some embodiments, each of the second conductive bumps 307 is a microbump with a height ranging from approximately 30 micrometers to approximately 80 micrometers, and the height of the microbump is 50 micrometers plus or minus 2 micrometers in some embodiments. In some embodiments, the second conductive bumps 307 have a height less than that of the first conductive bumps 103.

In some embodiments, a first underfill material 304 is disposed over the first substrate 101 and surrounds and/or encapsulates the first conductive bumps 103. In some embodiments, the first underfill material 304 directly contacts the lower surface of the second substrate 106, and fills spacing between two adjacent first conductive bumps 103. In some embodiments, the first underfill material 304 is an electrically insulated adhesive for protecting the first conductive bumps 103 or securing a bonding between the first substrate 101 and the second substrate 106. In some embodiments, the first underfill material 304 includes epoxy, resin, epoxy, molding compounds, etc. The first underfill material 304 can include a single homogenous composition in some embodiments, while in other embodiments can include multiple regions or layers with different material compositions.

In some embodiments, a second underfill material 309 is disposed over the second substrate 106 and surrounds the second conductive bumps 307 and the first die 302. In some embodiments, the second underfill material 309 is disposed over the first substrate 101 and surrounds the second conductive bumps 307, the first die 302, and the second die 320. In some embodiments, the second underfill material 309 encapsulates the second conductive bump 307. In some embodiments, the second underfill material 309 is in contact with the upper of the second substrate 106, the lower surfaces of the first die 302 and/or second die 320, and a portion of a sidewall of the first die 302 and/or second die 320. In some embodiments, the second underfill material 309 fills spacing between two adjacent second conductive bumps 307. In some embodiments, the second underfill material 309 is an electrically insulated adhesive for protecting the second conductive bumps 307 or securing a bonding between the second substrate 106 and the first die 302 and/or second die 320. In some embodiments, the second underfill material 309 includes epoxy, resin, epoxy, molding compounds, etc. The second underfill material 309 can include a single homogenous composition in some embodiments, while in other embodiments can include multiple regions or layers with different material compositions.

In some embodiments, the molding 305 is disposed over the first substrate 101 and surrounds the second substrate 106, the first die 302, and the second die 320. In some embodiments, the molding 305 is disposed over the first substrate 101 and surrounds the second substrate 106, but isn't over the first die 302 and the second die 320". In some embodiments, the molding 305 is disposed over the upper surface of the first substrate 101 and surrounds the second substrate 305, the first die 302, the second die 320, the first underfill material 304, and the second underfill material 309. In some embodiments, the molding 305 is in contact with a sidewall of the first die 302, the second die 320, the first underfill material 304, and the upper surface of the first substrate 101. In some embodiments, the molding 305 can be a single layer film or a composite stack. In some embodiments, the molding 305 includes various materials, such as molding compound, molding underfill, epoxy, resin, or the like. In some embodiments, the molding 305 has a high thermal conductivity, a low moisture absorption rate, and a high flexural strength.

In some embodiments, several third conductive bumps 310 are disposed below the first substrate 101. In some embodiments, the third conductive bump 310 is disposed at a third conductive pad 101d. In some embodiments, the third conductive bump 310 is in a cylindrical, spherical or hemispherical shape. In some embodiments, the third conductive bump 310 is a solder joint, a solder bump, a solder ball, a ball grid array (BGA) ball, a controlled collapse chip connection (C4) bump, microbump or the like. In some embodiments, the third conductive bump 310 is a conductive pillar or post. In some embodiments, the third conductive bump 310 includes metals such as lead, tin, copper, gold, nickel, etc.

The third conductive bumps 310 electrically couple the first substrate 101 to conductive pads and/or conductive traces on a printed circuit board 325. The printed circuit board 325 is configured to receive components, such as integrated chips, heat sinks, and/or discrete devices such as capacitors, resistors, inductors, and the like; and includes conductive features contained within a mechanical structure to couple the components to one another. The conductive features include copper traces, pads, or conductive planes; and the mechanical structure is made with insulating material laminated between layers of conductive material.

A multi-tier solder resist structure 308 is disposed between adjacent first conductive bumps 103. This multi-tier solder resist structure 308 is made of dielectric material, and provides solder bump openings having different widths at different heights over the first substrate 101. By limiting or preventing the adjacent first conductive bumps 103 from shorting or bridging to one another, the multi-tier solder resist structure 308 provides better manufacturing yield and/or reliability than previous techniques. In FIG. 3's example, the multi-tier solder resist structure 308 includes a base portion and an upper portion over the base portion. The lower portion has rounded sidewalls that taper inward to meet the upper portion, and the upper portion also has a rounded upper surface. This multi-tier solder resist structure 108 thereby allows for the openings to accommodate the conductive bumps 103 in a manner that limits bridging and/or shorting of the conductive bumps to provide higher yield and/or better reliability compared to previous approaches. In some cases, the first underfill 304 contacts the upper surface of the multi-tier solder resist structure.

Turning now to FIGS. 4-33, several different embodiments for multi-tier solder resist structures that can be inset into FIG. 3's structure are illustrated. It will be appreciated that the illustrated multi-tier solder resist structures are merely non-limiting examples, and other variations are contemplated as falling within the scope of the present disclosure. Further, each of these embodiments is illustrated with regards to a cross-sectional view, and several top views corresponding to different heights within the cross-sectional view, as indicated.

FIGS. 4-18 show several embodiments of various two-tier solder resist structures including dielectric material arranged in a first tier 108a and a second tier 108b. In each of these embodiments, the first tier 108a includes first tier conductive bump openings to accommodate base portions of the conductive bumps 103, and the second tier includes second tier conductive bump openings that accommodate mid- or upper-portions of the conductive bumps 103. The first tier 108a is made of or comprises a first dielectric material, and the second tier 108b is made of or comprises a second dielectric material that can have the same composition as the first dielectric material or can have a different composition from the first dielectric material. Further, in each of these embodiments, inner edges of the first tier 108a that define the first tier conductive bump openings are substantially concentric with inner edges of the second tier 108b that define the second tier conductive bump openings. Thus, the inner edges of the first tier 108a may, in fact, be concentric with the inner edges of the second tier 108b, or may have slight offsets due to misalignment in the photolithography process used to form the first tier 108a and second tier 108b. Further, in each of the embodiments of FIGS. 4-18, the first dielectric material of the first tier 108a can include epoxy or polymer or polyimide or any dielectric material, and the second dielectric material of the second tier 108b can include epoxy or polymer or polyimide or any dielectric material. The first dielectric material can have the same composition as the second dielectric material or can have a different composition from the second dielectric material, depending on the implementation.

Figure 4:
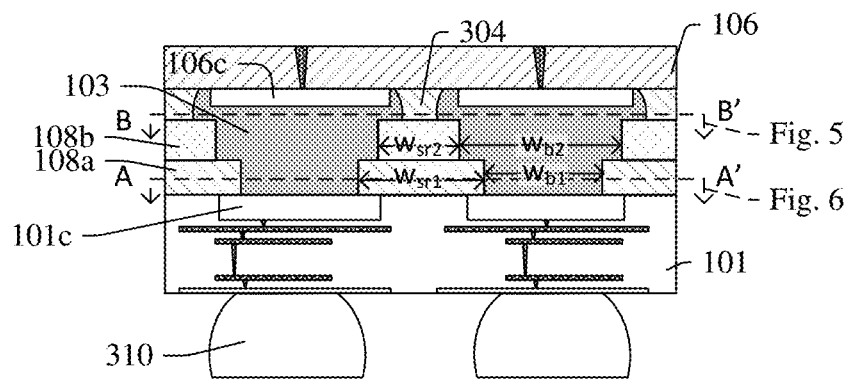
FIG. 4 illustrates a cross sectional view of a semiconductor structure in accordance with some embodiments of the present disclosure.
Figure 5:
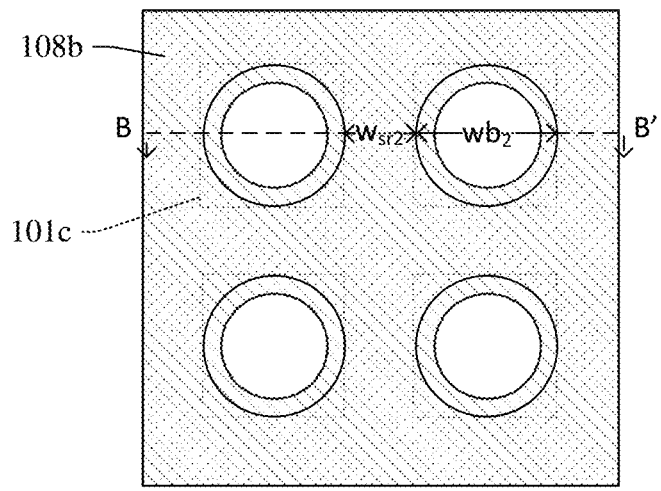
FIGS. 5-6 illustrate top views at various depths of the semiconductor structure in accordance with some embodiments of FIG. 4.
Figure 6:
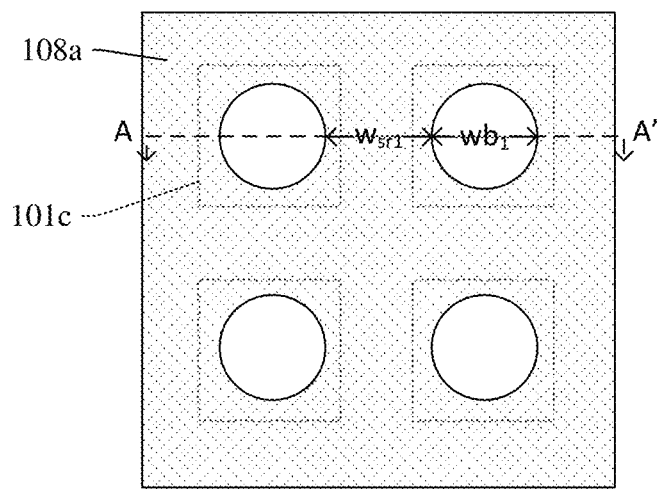

More particularly, FIGS. 4-6 illustrate a cross-sectional view (e.g., FIG. 4), and several top views (e.g., FIGS. 5-6) of an embodiment of a two-tier solder resist structure including dielectric material arranged in a first tier 108a and a second tier 108b. As can be seen by FIG. 6, the first tier 108a is a continuous field of made of a first dielectric material that is pieced by first tier conductive bump openings which accommodate base portions of the conductive bumps 103, and the second tier 108b is a continuous field of made of a second dielectric material that is pieced by second tier conductive bump openings which accommodate mid- or upper-portions of the conductive bumps 103. The first tier 108a can have a first width, $w_{sr1}$, ranging from 20 to 500 micrometer, and can extend over peripheral edges of adjacent connection structures of the first plurality of connection structures 101c. Thus, the first tier 108a defines a first tier conductive bump opening having a first opening width, $w_{b1}$, which can range from 20 to 500 micrometer, to accommodate a base portion of the conductive bump 103. The second tier 108b has a second width, $w_{sr2}$, which is less than the first width, $w_{sr1}$ and can range from 18 to 450 micrometer. Thus, the second tier 108b defines a second tier conductive bump opening having a second opening width, $w_{b2}$, which can range from 22 to 550 micrometer, to accommodate a mid- or upper-portion of the conductive bump 103.

In some cases, the multi-tier solder resist structure 108 increases a height of the conductive bumps 103 compared to previous approaches, and as such a height of the conductive bumps 103 measured from an upper surface of the first substrate 101 (e.g., upper surface of the first connection structure 101c) to a lower surface of the second substrate 106 (or lower surface of the second connection structure 106c) may, for example, range from approximately 20 to approximately 600 micrometer. In FIGS. 5-6, the first tier conductive bump opening and the second tier conductive bump opening are each circular, although in other embodiments they could be oval, polygonal, or have another geometry. Further, the first dielectric material of the first tier 108a is continuous between edges of nearest neighboring first conductive bump openings, the first dielectric material of the first tier 108a is a single continuous material between edges of nearest neighboring first conductive bump openings, though in other embodiments multiple layers can be present. This multi-tier solder resist structure 108 thereby allows for the openings to accommodate the conductive bumps 103 in a manner that limits bridging and/or shorting of the conductive bumps to provide higher yield and/or better reliability compared to previous approaches.

Figure 7:
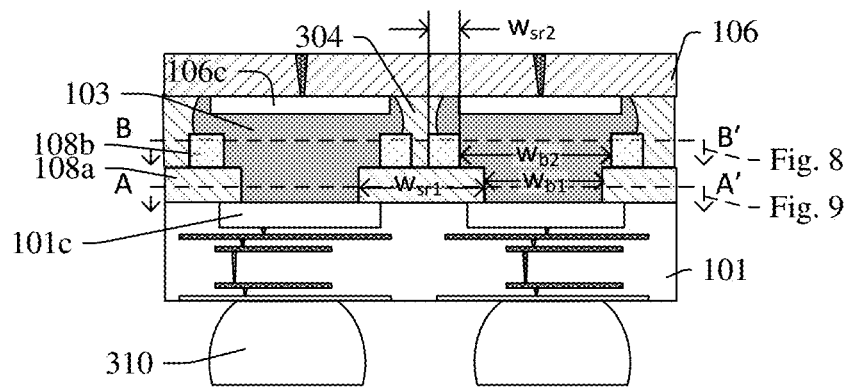
FIG. 7 illustrates a cross sectional view of a semiconductor structure in accordance with some embodiments of the present disclosure.
Figure 8:
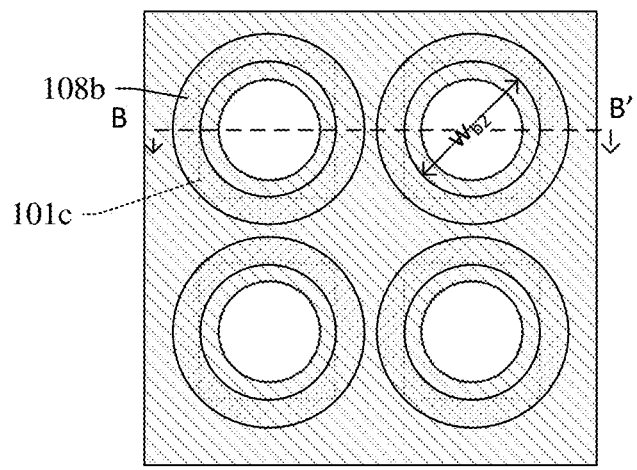
FIGS. 8-9 illustrate top views at various depths of the semiconductor structure in accordance with some embodiments of FIG. 7.
Figure 9:
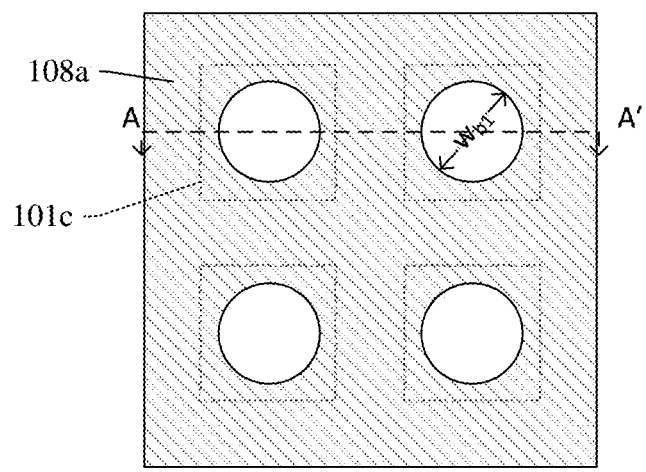

FIGS. 7-9 illustrate a cross-sectional view (e.g., FIG. 7), and several top views (e.g., FIGS. 8-9) that show another embodiment of a two-tier solder resist structure including dielectric material arranged in a first tier 108a and a second tier 108b. In some embodiments, the first tier 108a is again a continuous field of made of a first dielectric material that is pieced by first tier conductive bump openings which accommodate base portions of the conductive bumps 103 (see FIG. 9). As can be seen in FIG. 8, however, in this embodiment the second tier 108b includes a series of rings whose inner edges are substantially concentric with the inner edges of the first tier defined by the first tier conductive bump openings. Thus, the rings of the second tier may be, in fact concentric, with the inner edges of the first tier, or may have slight offsets due to misalignment in the photolithography process used to form the first tier 108a and second tier 108b. The first tier has a first width, $w_{sr1}$, ranging from 20 to 500 micrometer, and can extend over peripheral edges of adjacent connection structures of the first plurality of connection structures 101c. Thus, the first tier 108a defines a first tier conductive bump opening having a first opening width, $w_{b1}$, which can range from 20 to 500 micrometer, to accommodate a base portion of the conductive bump 103. The second tier 108b can have a second width, $w_{sr2}$, which is less than the first width, $w_{sr1}$ and can range from 13 to 445 micrometer. Thus, the second tier 108b defines a second tier conductive bump opening having a second opening width, $w_{b2}$, which can range from 22 to 550 micrometer, to accommodate a mid- or upper-portion of the conductive bump 103.

Figure 10:
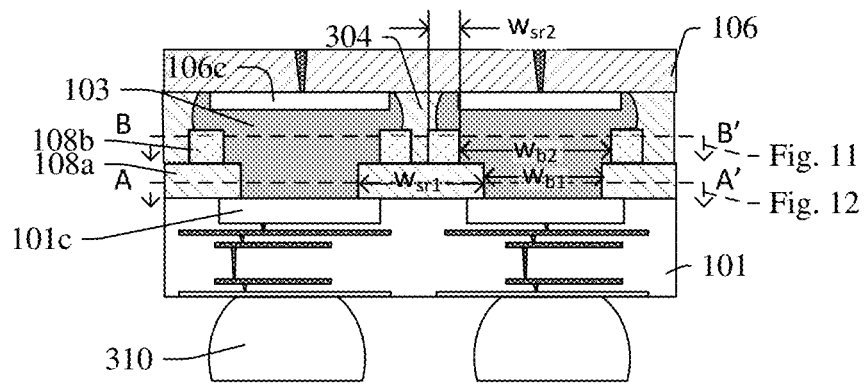
FIG. 10 illustrates a cross sectional view of a semiconductor structure in accordance with some embodiments of the present disclosure.
Figure 11:
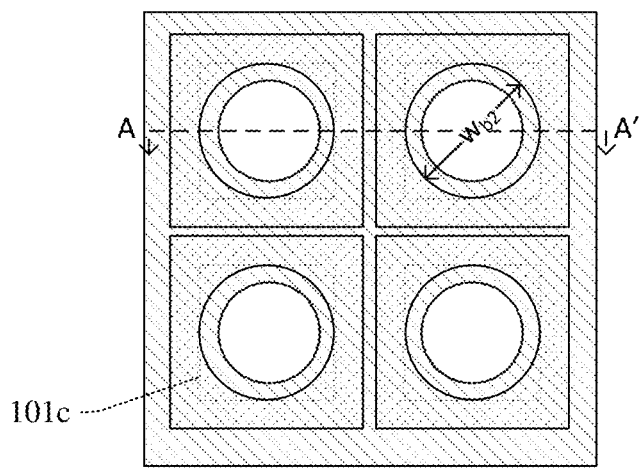
FIGS. 11-12 illustrate top views at various depths of the semiconductor structure in accordance with some embodiments of FIG. 10.
Figure 12:
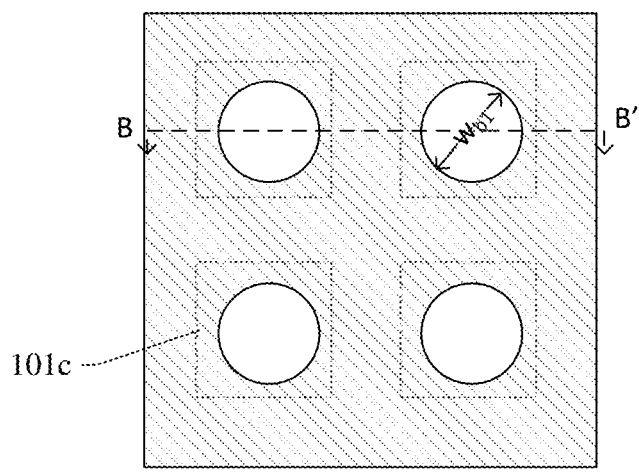

FIGS. 10-12 illustrate a cross-sectional view (e.g., FIG. 10), and several top views (e.g., FIGS. 10-11) that show another embodiment of a two-tier solder resist structure including dielectric material arranged in a first tier 108a and a second tier 108b. In this embodiment, the first tier 108a is again a continuous field of made of a first dielectric material that is pieced by first tier conductive bump openings which accommodate base portions of the conductive bumps 103 (see FIG. 9). As can be seen in FIG. 11, in this embodiment the second tier 108b includes a series of rings whose inner edges are substantially concentric with the inner edges of the first tier defined by the first tier conductive bump openings; but whose outer edges are squares. Thus, the rings of the second tier may be, in fact concentric, with the inner edges of the first tier, or may have slight offsets due to misalignment in the photolithography process used to form the first tier 108a and second tier 108b. The first tier 108a can have a first width, $w_{sr1}$, ranging from 20 to 500 micrometer, and can extend over peripheral edges of adjacent connection structures of the first plurality of connection structures 101c. Thus, the first tier 108a defines a first tier conductive bump opening having a first opening width, $w_{b1}$, which can range from 20 to 500 micrometer, to accommodate a base portion of the conductive bump 103. The second tier 108b can have a second width, $w_{sr2}$, which is less than the first width, $w_{sr1}$ and can range from 13 to 445 micrometer. Thus, the second tier 108b defines a second tier conductive bump opening having a second opening width, $w_{b2}$, which can range from 22 to 550 micrometer, to accommodate a mid- or upper-portion of the conductive bump 103.

Figure 13:
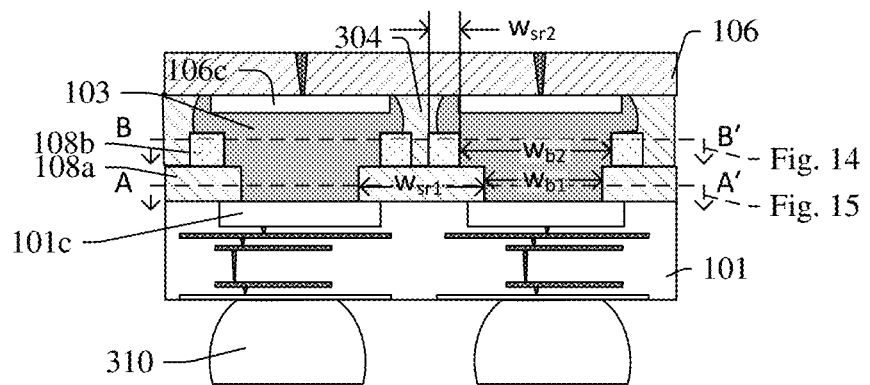
FIG. 13 illustrates a cross sectional view of a semiconductor structure in accordance with some embodiments of the present disclosure.
Figure 14:
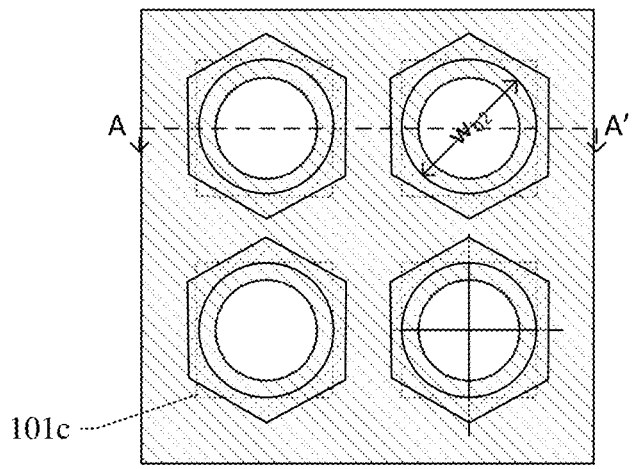
FIGS. 14-15 illustrate top views at various depths of the semiconductor structure in accordance with some embodiments of FIG. 13.
Figure 15:
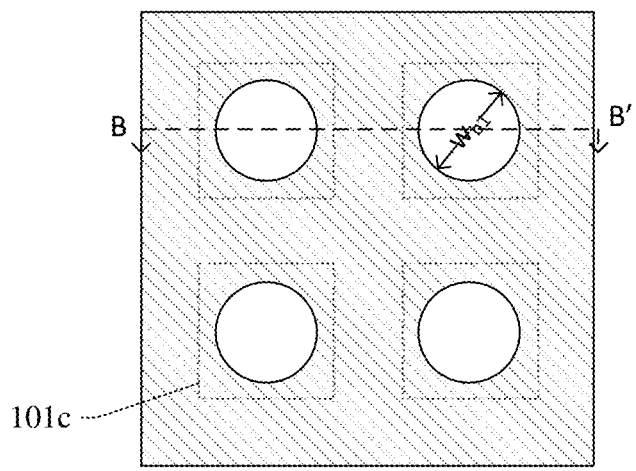

FIGS. 13-15 illustrate a cross-sectional view (e.g., FIG. 13), and several top views (e.g., FIGS. 14-15) that show another embodiment of a two-tier solder resist structure including dielectric material arranged in a first tier 108a and a second tier 108b. In this embodiment, the first tier 108a is again a continuous field of made of a first dielectric material that is pieced by first tier conductive bump openings which accommodate base portions of the conductive bumps 103 (see FIG. 9). As can be seen in FIG. 11, in this embodiment the second tier 108b includes a series of polygons whose inner edges are substantially concentric with the inner edges of the first tier defined by the first tier conductive bump openings; but whose outer edges define polygons (here hexagons). The first tier 108a can have a first width, $w_{sr1}$, ranging from 20 to 500 micrometer, and can extend over peripheral edges of adjacent connection structures of the first plurality of connection structures 101c. Thus, the first tier 108a defines a first tier conductive bump opening having a first opening width, $w_{b1}$, which can range from 20 to 500 micrometer, to accommodate a base portion of the conductive bump 103. The second tier 108b can include epoxy or polymer or polyimide or any dielectric material, and has a second width, $w_{sr2}$, which is less than the first width, $w_{sr1}$ and can range from 13 to 445 micrometer. Thus, the second tier 108b defines a second tier conductive bump opening having a second opening width, $w_{b2}$, which can range from 22 to 550 micrometer, to accommodate a mid- or upper-portion of the conductive bump 103.

Figure 16:
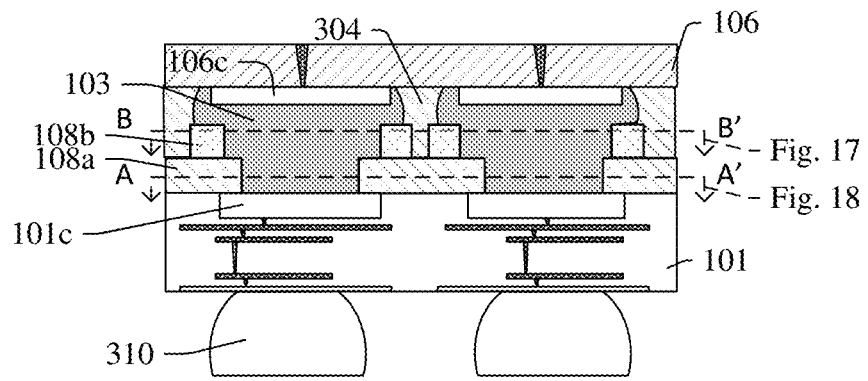
FIG. 16 illustrates a cross sectional view of a semiconductor structure in accordance with some embodiments of the present disclosure.
Figure 17:
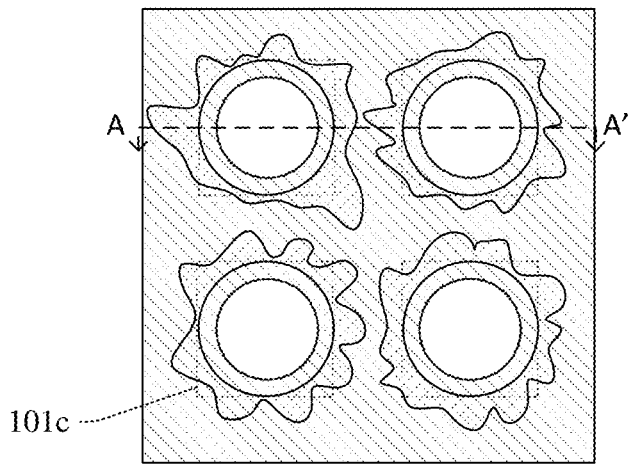
FIGS. 17-18 illustrate top views at various depths of the semiconductor structure in accordance with some embodiments of FIG. 16.
Figure 18:
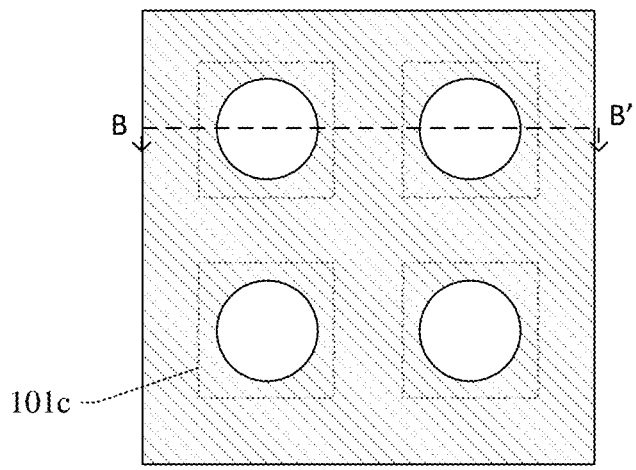
Figure 29:
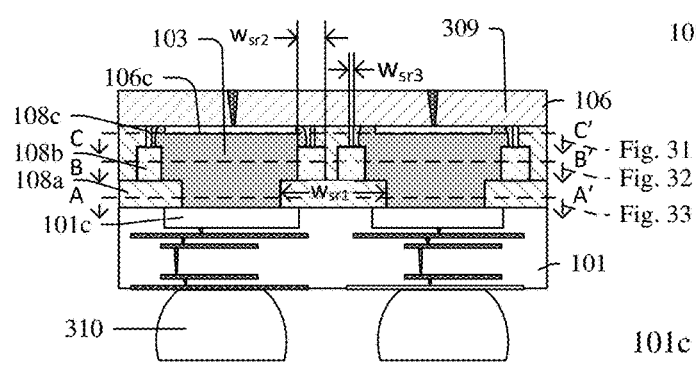
FIG. 29 illustrates a cross sectional view of a semiconductor structure in accordance with some embodiments of the present disclosure.
Figure 31:
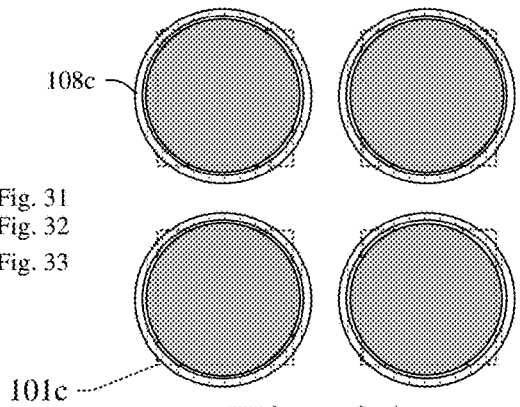
FIG. 31 illustrates a top view of a third tier in accordance with some embodiments of FIG. 29.
Figure 30:
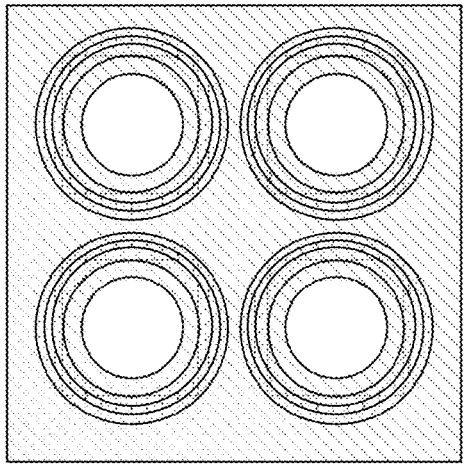
FIG. 30 illustrates a top view showing a first tier, a second tier, and a third tier superimposed over each other in accordance with some embodiments of FIG. 29.
Figure 32:
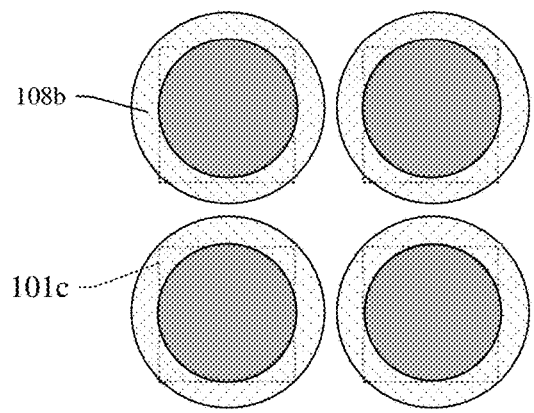
FIG. 32 illustrates a top view of a second tier in accordance with some embodiments of FIG. 29.
Figure 33:
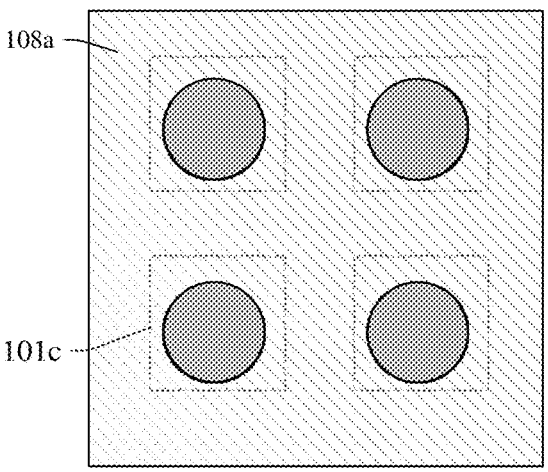
FIG. 33 illustrates a top view of a first tier in accordance with some embodiments of FIG. 29.

FIGS. 16-18 illustrate a cross-sectional view (e.g., FIG. 16), and several top views (e.g., FIGS. 17-18) that show another embodiment of a two-tier solder resist structure including dielectric material arranged in a first tier 108a and a second tier 108b. In this embodiment, the first tier 108a is again a continuous field of made of a first dielectric material that is pieced by first tier conductive bump openings which accommodate base portions of the conductive bumps 103 (see FIG. 18). As can be seen in FIG. 17, in this embodiment the second tier 108b includes a series of amoeba-like shapes whose inner edges are substantially concentric with the inner edges of the first tier 108a defined by the first tier conductive bump openings; but whose outer edges are different from one another.

FIGS. 19-33 show several embodiments of various semiconductor structures that include three-tier solder resist structures including dielectric material arranged in a first tier 108a, a second tier 108b, and a third tier 108c. In each of these embodiments, the first tier 108a includes first tier conductive bump openings to accommodate base portions of the conductive bumps 103, and the second tier includes second tier conductive bump openings that accommodate mid-portions of the conductive bumps 103, and the third tier includes third tier conductive bump openings that accommodate upper-portions of the conductive bumps 103. The first tier 108a is made of or comprises a first dielectric material, the second tier 108b is made of or comprises a second dielectric material, and the third tier 108c is made of or comprises a third dielectric material. The first dielectric material can have the same composition as the second dielectric material or can have a different composition from the second dielectric material, the second dielectric material can have the same composition as the third dielectric material or can have a different composition from the third dielectric material, and the first dielectric material can have the same composition as the third dielectric material or can have a different composition from the third dielectric material. Further, in each of these embodiments, inner edges of the first tier 108a that define the first tier conductive bump openings are substantially concentric with inner edges of the second tier 108b that define the second tier conductive bump openings, and are substantially concentric with inner edges of the third tier 108c that define the third tier conductive bump openings. Thus, the inner edges of the first tier 108a may, in fact, be concentric with the inner edges of the second tier 108b, or may have slight offsets due to misalignment in the photolithography process used to form the first tier 108a and second tier 108b; and the inner edges of the third tier 108c may, in fact, be concentric with the inner edges of the first and/or second tiers, or may have slight offsets due to misalignment in the photolithography process used to form the first tier 108a and/or second tier 108b. Further, in each of the embodiments of FIGS. 4-18, the first dielectric material of the first tier 108a can include epoxy or polymer or polyimide or any dielectric material, the second dielectric material of the second tier 108b can include epoxy or polymer or polyimide or any dielectric material, and the third dielectric material of the third tier 108b can include epoxy or polymer or polyimide or any dielectric material.

More particularly, FIGS. 19-23 illustrate a semiconductor structure that includes a solder resist structure with three tiers. FIGS. 19-23 include a cross-sectional view (e.g., FIG. 19), a top view showing a first tier 108a, a second tier 108b, and a third tier 108c superimposed over each other (e.g., FIG. 20), and several top views (e.g., FIGS. 20-23) that more clearly individually illustrate the first tier 108a, the second tier 108b, and the third tier 108c. In this embodiment, the first tier 108a is again a continuous field of made of a first dielectric material that is pieced by first tier conductive bump openings which accommodate base portions of the conductive bumps 103 (see FIG. 23). The second tier 108b is also a continuous field of made of a second dielectric material that is pieced by second tier conductive bump openings which accommodate mid-portions of the conductive bumps 103 (see FIG. 22). The third tier 108c is a continuous field of made of a third dielectric material that is pieced by third tier conductive bump openings which accommodate upper-portions of the conductive bumps 103 (see FIG. 21).

FIGS. 24-28 illustrate another embodiment of a semiconductor structure that includes a solder resist structure with three tiers. FIGS. 24-28 include a cross-sectional view (e.g., FIG. 24), a top view showing a first tier 108a, a second tier 108b, and a third tier 108c superimposed over each other (e.g., FIG. 25), and several top views (e.g., FIGS. 26-28) that more clearly individually illustrate the first tier 108a, the second tier 108b, and the third tier 108c. In this embodiment, the first tier 108a is again a continuous field of made of a first dielectric material that is pieced by first tier conductive bump openings which accommodate base portions of the conductive bumps 103 (see FIG. 28). The second tier 108b is also a continuous field of made of a second dielectric material that is pieced by second tier conductive bump openings which accommodate mid-portions of the conductive bumps 103 (see FIG. 27). The third tier 108c is made of a third dielectric material that includes circular rings which accommodate upper-portions of the conductive bumps 103 (see FIG. 28). Though FIGS. 24-28 illustrate circular rings, it will be appreciated that square rings (such as previously illustrated in FIGS. 10-12), polygonal rings (such as previously illustrated in FIGS. 13-15), and/or other shaped rings (such as amoeba-like rings of FIGS. 16-18) can be substituted in place of the illustrated circular rings of FIGS. 24-28, and are contemplated as falling within the scope of the present disclosure.

FIGS. 29-33 illustrate another embodiment of a semiconductor structure that includes a solder resist structure with three tiers. FIGS. 29-33 include a cross-sectional view (e.g., FIG. 29), a top view showing a first tier 108a, a second tier 108b, and a third tier 108c superimposed over each other (e.g., FIG. 30), and several top views (e.g., FIGS. 31-33) that more clearly individually illustrate the first tier 108a, the second tier 108b, and the third tier 108c. In this embodiment, the first tier 108a is again a continuous field of made of a first dielectric material that is pieced by first tier conductive bump openings which accommodate base portions of the conductive bumps 103 (see FIG. 33). The second tier 108b is made of a second dielectric material that includes circular rings which accommodate mid-portions of the conductive bumps 103 (see FIG. 32). The third tier 108c is made of a third dielectric material that includes circular rings which accommodate upper-portions of the conductive bumps 103 (see FIG. 31). Though FIGS. 29-33 illustrate circular rings for the second tier 108b and third tier 108c, it will be appreciated that square rings (such as previously illustrated in FIGS. 10-12), polygonal rings (such as previously illustrated in FIGS. 13-15), and/or other shaped rings (such as amoeba-like rings of FIGS. 16-18) can be substituted in place of the illustrated circular rings of the second tier 108b and/or third tier 108c of FIGS. 29-33, and are contemplated as falling within the scope of the present disclosure.

Figure 34:
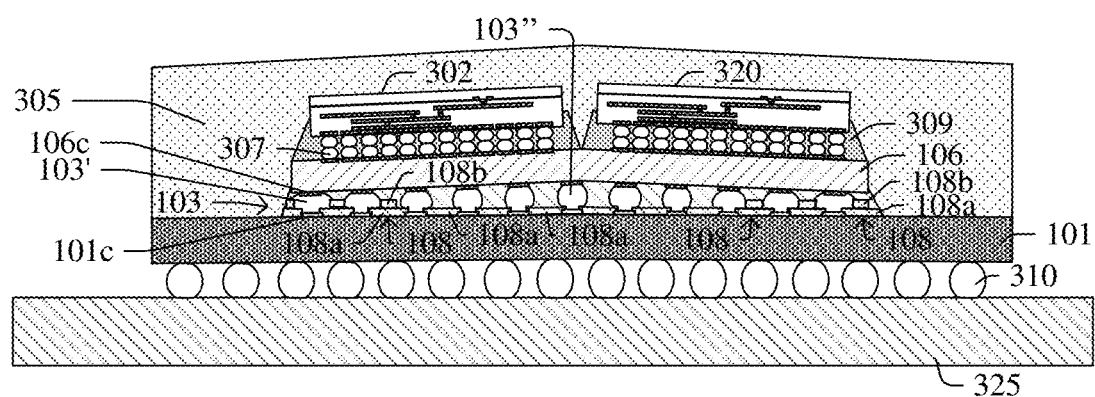
FIG. 34 illustrates a cross sectional view of a semiconductor structure in accordance with some embodiments of the present disclosure.

FIG. 34 illustrates still another embodiment of a semiconductor structure that includes a solder resist structure with multiple tiers. In FIG. 34, however, the first tier 108a and second tier 108b of the solder resist structure is not found around each and every first conductive bump 103, but rather the higher tiers (e.g. second tiers 108b) are located between selected first conductive bumps that are predetermined to be susceptible to "bridging" or shorting due to substrate warpage. More particularly, in FIG. 34, the first substrate 106 is warped, meaning that it has regions that are curved or offset from a plane in which the first substrate is generally aligned. This warpage can cause some of some of the first conductive bumps 103 to be "squeezed" or compressed vertically relative to others. For example, although first conductive bumps 103' and 103" may have equal volumes, the first conductive bump 103' is shorter and wider, while first conductive bump 103" is taller and narrower, due to warpage of substrate 106. This warpage makes the first conductive bump 103' susceptible to shorting to nearest neighboring first conductive bumps, and therefore, to mitigate this risk, a multi-tiered solder resist structure 108 is selectively arranged near these bridge-susceptible first conductive bumps. Thus, in this example, a first tier 108a of a solder resist structure is present between all neighboring first conductive bumps, and a second tier 108b is formed only between bridge-susceptible first conductive bumps. Though previous embodiments of FIGS. 1-33 illustrated various multi-tier solder resist structures as being disposed about each of the first conductive bumps, any of these previous embodiments could also arrange its multi-tier solder resist structure about only selective first conductive bumps while other first conductive bumps have only a first tier 108a of a solder-resist structure.

Some embodiments relate to a semiconductor structure. The semiconductor structure includes a first substrate including a first plurality of conductive pads that are laterally spaced apart from one another on the first substrate. A first plurality of conductive bumps are disposed on the first plurality of conductive pads, respectively. A multi-tiered solder-resist structure is disposed on the first substrate and arranged between the first plurality of conductive pads. The multi-tiered solder-resist structure has different widths at a different heights over the first substrate and contacts sidewalls of the first plurality of conductive bumps to separate the first plurality of conductive bumps from one another.

Other embodiments relate to a semiconductor structure. The semiconductor structure includes a first substrate including a first surface and a second surface opposite to the first surface. A first die is disposed over the second surface of the first substrate. A second die is disposed over the second surface of the first substrate and adjacent to the first die. A plurality of first conductive bumps are disposed between the first substrate and the first die and between the first substrate and the second die. A second substrate is disposed below the first surface of the first substrate. A plurality of second conductive bumps are disposed between the first substrate and the second substrate. A multi-tiered solder-resist structure is disposed on the first substrate and arranged between the first plurality of conductive pads. The multi-tiered solder-resist structure has different widths at a different heights over the first substrate and contacts sidewalls of the first plurality of conductive bumps to separate the first plurality of conductive bumps from one another.

Still other embodiments relate a semiconductor structure. The semiconductor structure includes a first substrate including a first plurality of conductive pads that are laterally spaced apart from one another on the first substrate. A second substrate includes a second plurality of conductive pads that are laterally spaced apart from one another on the second substrate. A first plurality of conductive bumps are disposed on the first plurality of conductive pads, respectively. A multi-tiered solder-resist structure vertically separates the first substrate and the second substrate and laterally separates adjacent conductive bumps of the first plurality of conductive bumps from one another. The multi-tiered solder-resist structure includes conductive bump openings having different widths at a different heights over the first substrate and though which the first plurality of conductive bumps pass such that the multi-tiered solder-resist structure separates the first plurality of conductive bumps from one another.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first substrate including a first plurality of conductive pads that are laterally spaced apart from one another on the first substrate;
   a first plurality of conductive bumps disposed on the first plurality of conductive pads, respectively; and
   a multi-tiered solder-resist structure comprising a dielectric material disposed on the first substrate, the dielectric material extending continuously along a lateral plane from a first sidewall of a first conductive bump of the first plurality of conductive bumps to a second sidewall of a second conductive bump of the first plurality of conductive bumps, the multi-tiered solder-resist structure having different widths at different heights over the first substrate and contacting sidewalls of the first plurality of conductive bumps at each of the different heights to separate the first plurality of conductive bumps from one another;
   wherein a width of the dielectric material as measured between the first sidewall and the second sidewall on the lateral plane is less than a width of the first conductive bump as measured between outermost sidewalls of the first conductive bump along the lateral plane.

2. The semiconductor structure of claim 1, further comprising:
   a second substrate including a second plurality of conductive pads that are laterally spaced apart from one another on the second substrate, wherein the first plurality of conductive bumps couple the second plurality of conductive pads to the first plurality of conductive pads.

3. The semiconductor structure of claim 2, wherein an uppermost surface of the multi-tiered solder-resist structure is spaced apart from a lower surface of the second substrate by a gap.

4. The semiconductor structure of claim 3, further comprising:
   a molding material disposed over the first substrate and filling the gap.

5. The semiconductor structure of claim 2, further comprising:
   a first die disposed over a first portion of the second substrate and connected to the second substrate through a first plurality of microbumps; and
   a second die disposed over a second portion of the second substrate and connected to the second substrate through a second plurality of microbumps.

6. The semiconductor structure of claim 5, wherein the second substrate is a second interposer substrate devoid of active semiconductor devices.

7. The semiconductor structure of claim 1, wherein the multi-tiered solder-resist structure comprises:
   a first tier comprising a first dielectric material and including first conductive bump openings defined by inner sidewalls of the first tier, the first tier having a first width measured through the first dielectric material between the inner sidewalls of the first tier; and
   a second tier comprising a second dielectric material and including second conductive bump openings defined by inner sidewalls of the second tier, the second tier having a second width measured through the second dielectric material between the inner sidewalls of the second tier;
   wherein the first width is greater than the second width.

8. The semiconductor structure of claim 1, wherein the multi-tiered solder-resist structure comprises:
   a first tier comprising a first dielectric material and including first conductive bump openings defined by inner sidewalls of the first tier, the first tier having a first width measured through the first dielectric material between the inner sidewalls of the first tier;
   a second tier comprising a second dielectric material and including second conductive bump openings defined by inner sidewalls of the second tier, the second tier having a second width measured through the second dielectric material between the inner sidewalls of the second tier; and
   a third tier comprising a third dielectric material and including third conductive bump openings defined by inner sidewalls of the third tier, the third tier having a third width measured through the third dielectric material between the inner sidewalls of the third tier;
   wherein the first width is greater than the second width, and wherein the second width is greater than third width.

9. The semiconductor structure of claim 8, wherein the first conductive bump openings are substantially concentric with the second conductive bump openings and are substantially concentric with the third conductive bump openings.

10. The semiconductor structure of claim 1, wherein the first substrate is an interposer substrate devoid of active semiconductor devices.

11. The semiconductor structure of claim 1, wherein an uppermost surface of the multi-tiered solder-resist structure has a height as measured from an upper surface of the first substrate which is more than half of a maximum height of the first plurality of conductive bumps as measured from the upper surface of the first substrate.

12. A semiconductor structure, comprising:
a first substrate including a first surface and a second surface opposite to the first surface;
a first die disposed over the second surface of the first substrate;
a second die disposed over the second surface of the first substrate and adjacent to the first die;
a plurality of first conductive bumps disposed between the first substrate and the first die and between the first substrate and the second die;
a second substrate disposed below the first surface of the first substrate;
a plurality of second conductive bumps disposed between the first substrate and the second substrate;
a multi-tiered solder-resist structure disposed on the second substrate and arranged between the plurality of second conductive bumps, the multi-tiered solder-resist structure having different widths at different heights over the second substrate and contacting sidewalls of the plurality of second conductive bumps to separate the plurality of second conductive bumps from one another;
a first underfill material disposed over the first substrate and surrounding the plurality of first conductive bumps; and
a second underfill material disposed over the second substrate and surrounding the plurality of second conductive bumps.

13. The semiconductor structure of claim 12, further comprising:
a molding material disposed over the second substrate and surrounding the first die, surrounding the second die, surrounding the plurality of first conductive bumps, and surrounding the plurality of second conductive bumps.

14. The semiconductor structure of claim 12, wherein a width of dielectric material as measured between inner sidewalls of the multi-tiered solder-resist structure is less than a width of a conductive bump of the plurality of second conductive bumps.

15. A semiconductor structure, comprising:
a first substrate including a first plurality of conductive pads that are laterally spaced apart from one another on the first substrate;
a second substrate including a second plurality of conductive pads that are laterally spaced apart from one another on the second substrate;
a first plurality of conductive bumps disposed on the first plurality of conductive pads, respectively; and
a multi-tiered solder-resist structure vertically separating the first substrate and the second substrate and laterally separating adjacent conductive bumps of the first plurality of conductive bumps from one another, the multi-tiered solder-resist structure including conductive bump openings having different widths at different heights over the first substrate and through which the first plurality of conductive bumps pass such that the multi-tiered solder-resist structure separates the first plurality of conductive bumps from one another;
wherein the multi-tiered solder-resist structure comprises:
a first tier comprising a first dielectric material and including first conductive bump openings defined by inner sidewalls of the first tier, the first tier having a first width measured through the first dielectric material between the inner sidewalls of the first tier; and
a second tier overlying the first tier, the second tier comprising a second dielectric material and including second conductive bump openings defined by inner sidewalls of the second tier, the second tier having a second width measured through the second dielectric material between the inner sidewalls of the second tier; and
a third tier overlying the second tier, the third tier comprising a third dielectric material and including third conductive bump openings defined by inner sidewalls of the third tier, the third tier having a third width measured through the third dielectric material between the inner sidewalls of the third tier;
wherein the first width is greater than the second width, and wherein the second width is greater than third width;
wherein the inner sidewalls of the third tier are directly over a top surface of the second tier, and wherein a top surface of the third tier is above bottom surfaces of the second plurality of conductive pads.

16. The semiconductor structure of claim 15, wherein the multi-tiered solder-resist structure surrounds the first plurality of conductive bumps and extends directly between the first plurality of conductive bumps.

17. The semiconductor structure of claim 15, wherein the inner sidewalls of the second tier are directly over a top surface of the first tier, and wherein the first plurality of conductive bumps are on the inner sidewalls of the first tier, the top surface of the first tier, the inner sidewalls of the second tier, and the top surface of the second tier.

18. The semiconductor structure of claim 15, wherein the first dielectric material extends continuously along a lateral plane from a first sidewall of a first conductive bump of the first plurality of conductive bumps to a second sidewall of a second conductive bump of the first plurality of conductive bumps.

19. The semiconductor structure of claim 15, wherein an uppermost surface of the multi-tiered solder-resist structure has a height as measured from an upper surface of the first substrate which is more than half of a maximum height of the first plurality of conductive bumps as measured from the upper surface of the first substrate.

20. The semiconductor structure of claim 15, wherein the third width as measured along a lateral plane is less than a width of a conductive bump opening of the first conductive bump openings as measured along the lateral plane.

* * * * *